United States Patent [19]

Kim

[11] Patent Number: 5,675,957
[45] Date of Patent: Oct. 14, 1997

[54] DEVICE LOADING/UNLOADING APPARATUS FOR SEMICONDUCTOR DEVICE HANDLER

[75] Inventor: Du Chul Kim, Chunan, Rep. of Korea

[73] Assignee: Mirae Corporation, Rep. of Korea

[21] Appl. No.: 615,021

[22] Filed: Mar. 13, 1996

[30] Foreign Application Priority Data

Apr. 24, 1995 [KR] Rep. of Korea ............... 9646/1995

[51] Int. Cl.$^6$ .................................................. B65B 5/04
[52] U.S. Cl. ................ 53/242; 53/246; 414/222; 414/225
[58] Field of Search ........................... 414/222, 223, 414/224, 225, 226; 53/242, 246, 250, 258, 580, 284.5

[56] References Cited

U.S. PATENT DOCUMENTS

| | | | |
|---|---|---|---|
| 4,406,572 | 9/1983 | Karcher | 414/417 X |
| 4,494,902 | 1/1985 | Kuppens et al. | 414/223 |
| 4,534,695 | 8/1985 | Stump et al. | 414/225 X |
| 4,611,966 | 9/1986 | Johnson | 414/226 X |
| 4,728,243 | 3/1988 | Kliewer | 414/226 X |
| 4,907,701 | 3/1990 | Kobayashi et al. | 414/225 X |
| 5,148,100 | 9/1992 | Sekiba | 414/224 X |
| 5,227,717 | 7/1993 | Tsurishima et al. | 414/222 X |

*Primary Examiner*—Daniel Moon
*Attorney, Agent, or Firm*—Anthony J. Casella; Gerald E. Hespos; Ludomir A. Budzyn

[57] ABSTRACT

A device loading/unloading apparatus for a device handler is disclosed including a customer tray containing a finished device; a test tray having a plurality of carrier modules, the carrier modules forming a space on its bottom so that the device's bottom is mounted to be exposed downward, the carrier modules having a stop member for supporting the device not to fall freely from the space; bottom loading assembly for picking up the device of the customer tray, moving it under the test tray, and loading it to a bottom space of the carrier module; and stop member spreading assembly installed above the test tray to be conveyable in the same direction as the bottom loading assembly and then spreading the stop member by a predetermined interval when the bottom loading assembly loads/unloads the device on/from the space of the carrier module.

11 Claims, 14 Drawing Sheets

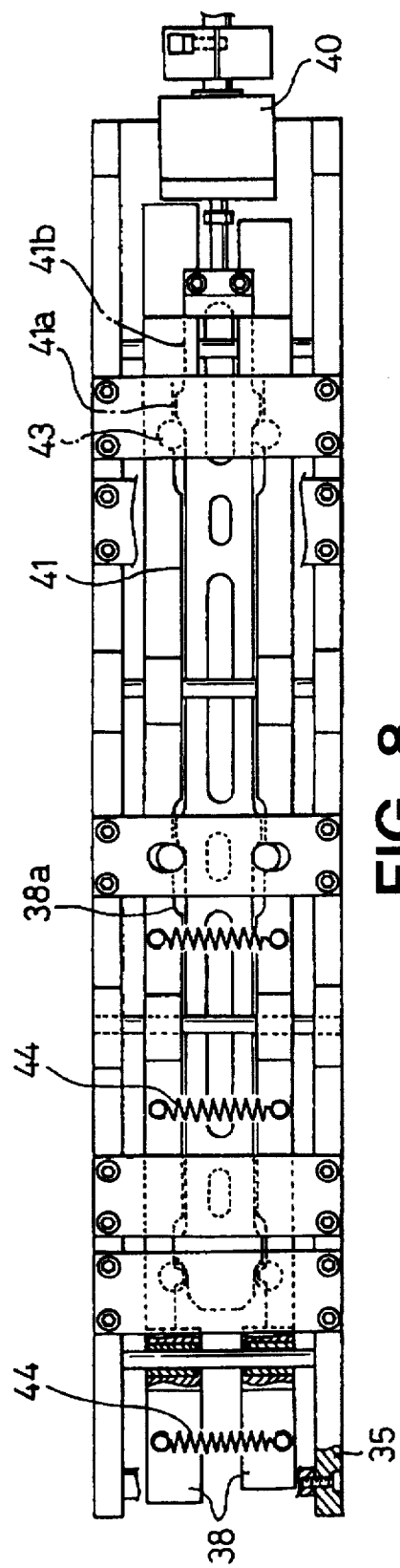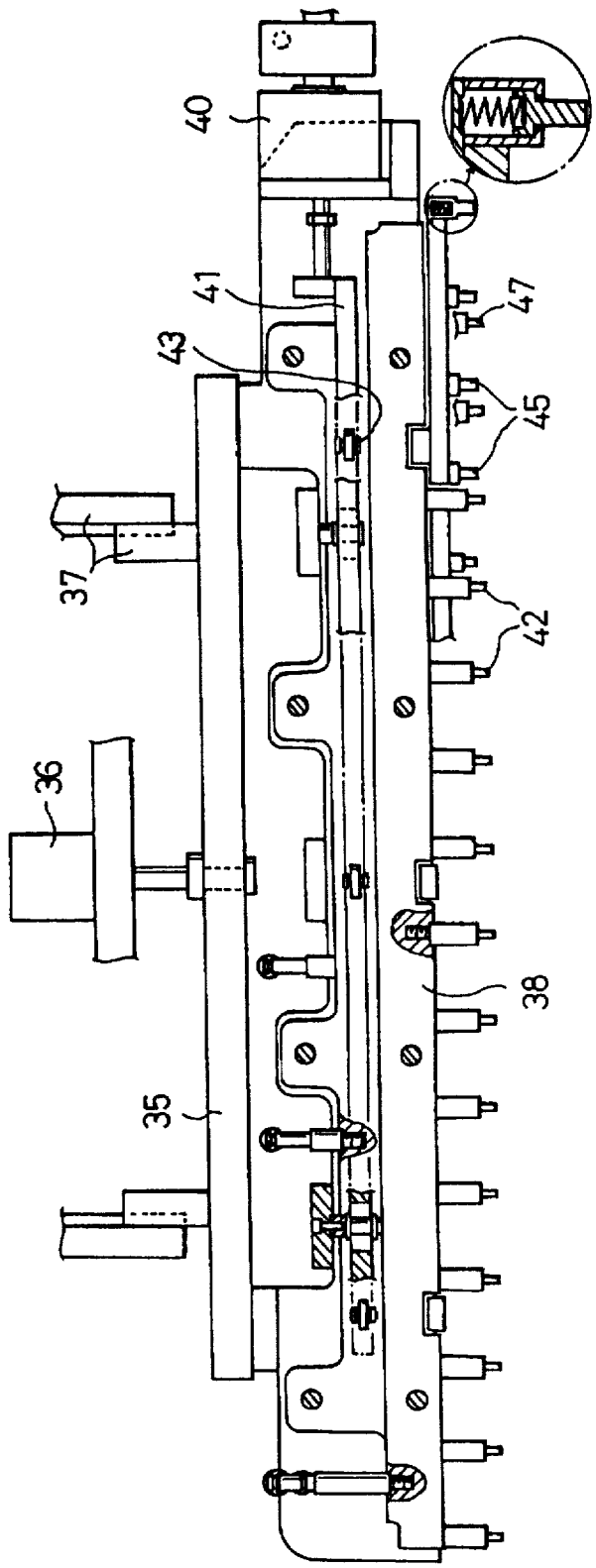
FIG. 7
FIG. 8

DEVICE LOADING/UNLOADING APPARATUS FOR SEMICONDUCTOR DEVICE HANDLER

BACKGROUND OF THE INVENTION

1. Field of the Invention

The present invention relates to a handler for checking finished devices, and an apparatus for loading/unloading a device contained in a plastic customer tray onto/from a metal test tray. More particularly, this invention relates to an apparatus for loading devices of thin small outline package (TSOP) type to the test tray from thereunder, or unloading them from the test tray.

2. Description of the Prior Art

Recently, along a trend of lightness and simplification of components, semiconductor devices are becoming thinner, one of which is TSOP.

The TSOP is as thick as about 1 mm, its performance is checked by a handler after its production. While carried to a testing process of the handler, the characteristics of TSOP may be deteriorated in case its top or bottom receives impacts due to careless treatment. For the worst case, the molded chip is damaged. It is important not to give impacts to TSOP when carried inside the handler or tested in the test tray.

The TSOP is carried and kept during its production process in the space of the plastic customer tray. During a test after production, it is contained in a carrier module of a test tray of precisely processed metal or heat-resistant synthetic resin. This is to ensure a sufficient contact between the device's lead and the test head's contactor in order not to judge good devices as poor because they are tested in the test portion with their position crooked.

A handler must have an apparatus for loading the devices contained in the customer tray to the test tray, or unloading the test-finished devices to the customer tray from the test tray.

A conventional device loading/unloading apparatus is as shown in FIGS. 1, 2 and 3. A customer tray 3 with device 2 is put on a loading stage 1. A test tray 6 with a plurality of carrier modules 5 is placed along guide rail 4. Between customer tray 3 and test tray 6, a device pickup means 7 for adsorbing device 2 contained in customer tray 3 to load it on test tray 6, or adsorbing the device contained in the test tray to unload it on the customer tray, is installed to be conveyable along a side beam 8.

In the above structure, space 3a formed in customer tray 3 functions only to accept the devices. For this reason, the space has a low precision so that device 2 placed in space 3a is not accurately loaded on carrier module 5 after being adsorbed by device pickup means 7. Therefore, a position determining block 9 is installed between customer tray 3 and test tray 6, in order to correct the device's position.

In device pickup means 7, pickups 10 are installed as many as the number of spaces 3a formed in customer tray 3 in order to simultaneously adsorb one row of devices 2 contained in customer tray 3. Device pickup means 7 is designed to rectilinearly move along a connection beam 12 with a step motor 11 driven.

Test tray 6 on which device 2 contained in customer tray 3 is loaded is formed with carrier module 5. As shown in FIGS. 2 and 3, the carrier module includes a space 5a formed in the same shape of device 2 at the center, a upper guide hole 5b whose intake is tapered, a lower guide hole 5c into which a position determining pin is inserted, a hook 5d formed on both sides of the carrier module in order to couple it onto frame 13 of test tray 6, and a slit 5e formed on both sides of the space for isolating leads 2a of the device. In this configuration, carrier module 5 is movably coupled into coupling hole 13a formed in frame 13, using hook 5d.

Hereinafter, there will be explained a procedure in which one row of devices 2 contained in customer tray 3 are adsorbed by device pickup means 7, their position is corrected by position determining block 9, and then the devices are loaded in carrier module 5 of test tray 6.

First of all, customer tray 3 with device 2 is loaded on loading stage 1 by a carrier. In this state, when step motor 11 is driven, connection beam 12 to which device pickup means 7 is coupled is guided to side beam 8, and then moves toward customer tray 3. When device pickup means 7 moves toward customer tray 3, pickup 10 installed under device pickup means 7 stops to be placed along a straight line with one row of the devices contained in space 3a of customer tray 3.

When pickup 10 is along the same straight line as one row of devices 2 by connection beam 12, device pickup means 7 horizontally moves along connection beam 12 by a step motor controlling signal produced from a control module of a controller (not shown) so that pickup 10 is placed directly above device 2.

Thereafter, pickup 10 is lowered to adsorb device 2 placed in space 3a due to air pressure. Device 2 adsorbed by pickup 10 is carried directly above position determining block 9 and falls freely into space 9a of position determining block 9, with step motor 11 driven. Device 2 is guided to inclined surface 9b formed on the side of the intake of space 9a, and then mounted on the space. This corrects the devices' position. Here, space 9a of the position determining block and the space of carrier module 5 are in the precisely same arrangement.

After the devices' position is corrected, pickup 10 of device pickup means 7 is lowered to re-adsorb device 2 placed in space 9a of position determining block 9. Once pickup 10 adsorbs device 2, step motor 11 is driven so that device pickup means 7 is carried to coincide with one row of carrier modules 5 of test tray 6.

After device pickup means 7 is carried directly above test tray 6 through the above-stated operation, the air pressure acting to pickup 10 directly above space 5a of carrier module 5 is released. Accordingly, device 2 adsorbed to pickup 10 is mounted on the bottom of space 5a of carrier module 5 due to its own weight. Here, the devices' leads 2a are isolated from one another by slits 5e so that nearby leads do not short when contacted to the test head's contactor.

After devices 2 contained in space 3a of the customer tray are sequentially carried and all loaded in space 5a of carrier module 5, the test tray is heated appropriately according to test conditions in a soak chamber (not shown), and then conveyed to the test portion. Devices' leads 2a come into contact with the test head's contactor in the test portion so that their performance is judged by a CPU for them to be classified into good or poor devices.

After finishing the devices' performance test, test tray 6 carries them to a unloading stage (not shown). Devices 2 contained in space 5a of carrier module 5 are adsorbed by the pickup of another device pickup means, and directly unloaded into the space of an empty customer tray. However, the conventional apparatus has the following drawbacks.

First, the device pickup means adsorbs devices in the position determining block and makes them fall freely above the space of the carrier module. This may cause the devices loaded in the carrier module to be placed inaccurately. In other words, this may judge a good device as poor.

Secondly, the position of the devices contained in the space may vary due to impacts produced while the test tray is carried. This also may judge a good device as poor.

Thirdly, the test head installed in the test portion must be placed above the test portion. This inconveniences replacing the test head, which is heavy, whenever a variety of devices are tested.

Fourthly, the devices contained in the customer tray are adsorbed, position-determined in the space of the position determining block, and then loaded in the space of the carrier module of the test tray. This delays time to load devices.

SUMMARY OF THE INVENTION

Therefore, in order to overcome such drawbacks, it is an object of the present invention to provide a loading/unloading apparatus for a semiconductor device handler in which, when a pickup means adsorbs a device contained in a space of a customer tray and then puts it on a device bottom loading means, a device loading means is capable of loading the device carried under a test tray into the space of a carrier module from thereunder.

To accomplish the object of the present invention, there is provided a device loading/unloading apparatus for a device handler comprising: a customer tray containing a finished device; a test tray having a plurality of carrier modules, the carrier modules forming a space on its bottom so that the device's bottom is mounted to be exposed downward, the carrier modules having a stop member for supporting the device not to fall freely from the space; bottom loading means for picking up the device of the customer tray, moving it under the test tray, and loading it to a bottom space of the carrier module; and stop member spreading means installed above the test tray to be conveyable in the same direction as the bottom loading means, the means spreading the stop member by a predetermined interval when the bottom loading means loads/unloads the device on/from the space of the carrier module.

BRIEF DESCRIPTION OF THE ATTACHED DRAWINGS

FIG. 7 is a plan view of a stop member spreading means of the present invention;

FIG. 8 is a front view of the means of FIG. 7, part of which is viewed in section;

Figure 10A:
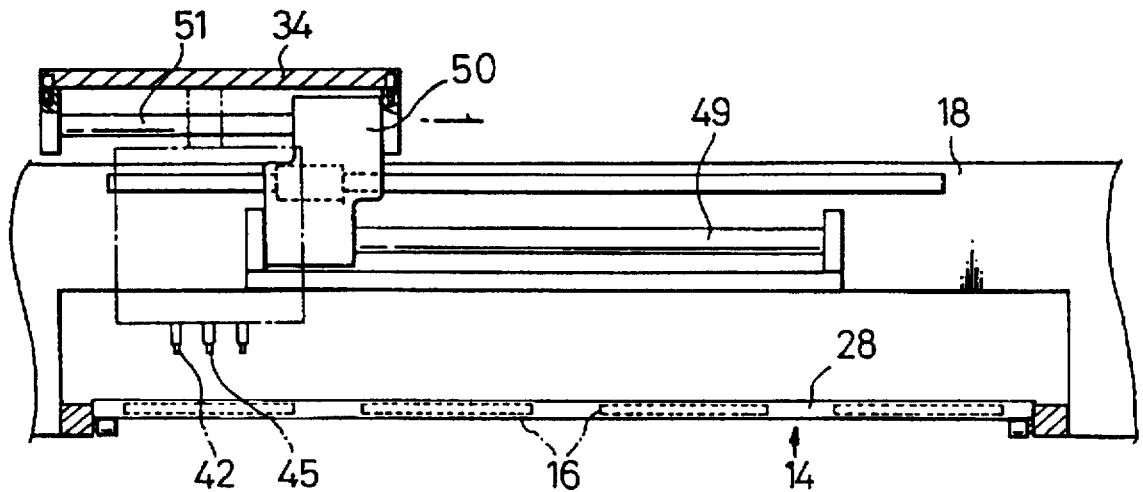
Figure 10B:
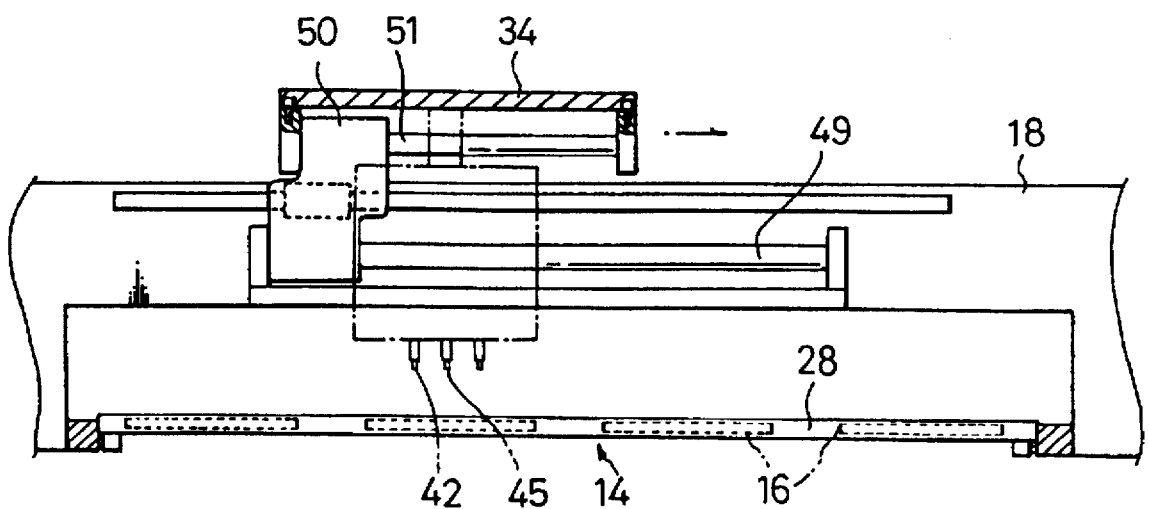
Figure 10C:
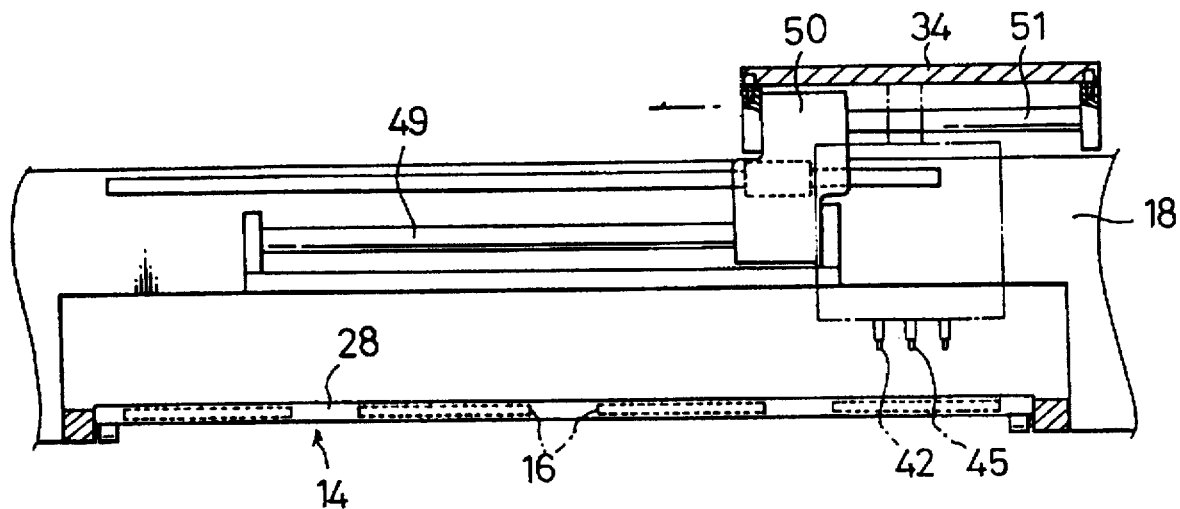
Figure 10D:
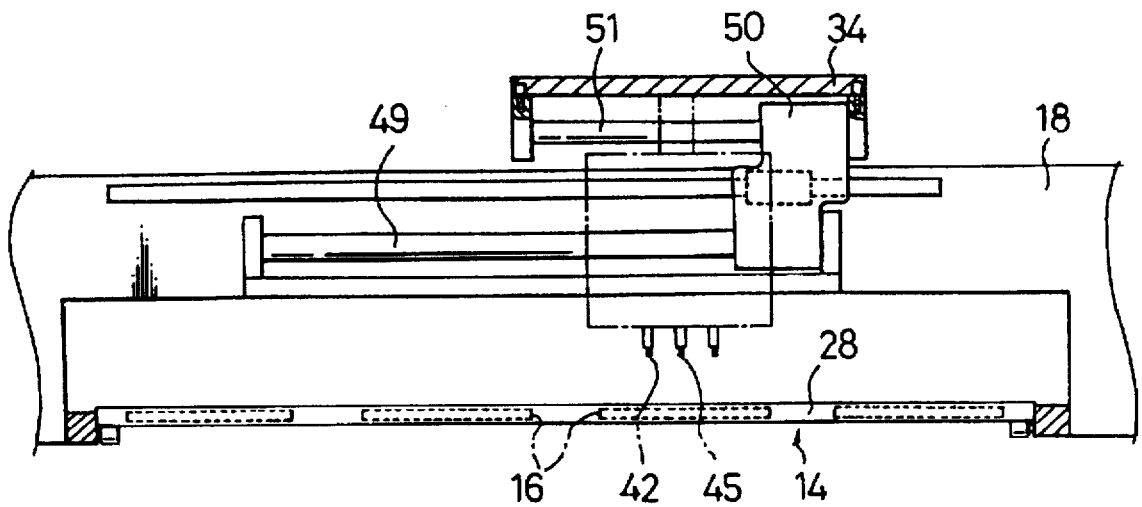
Figure 11:
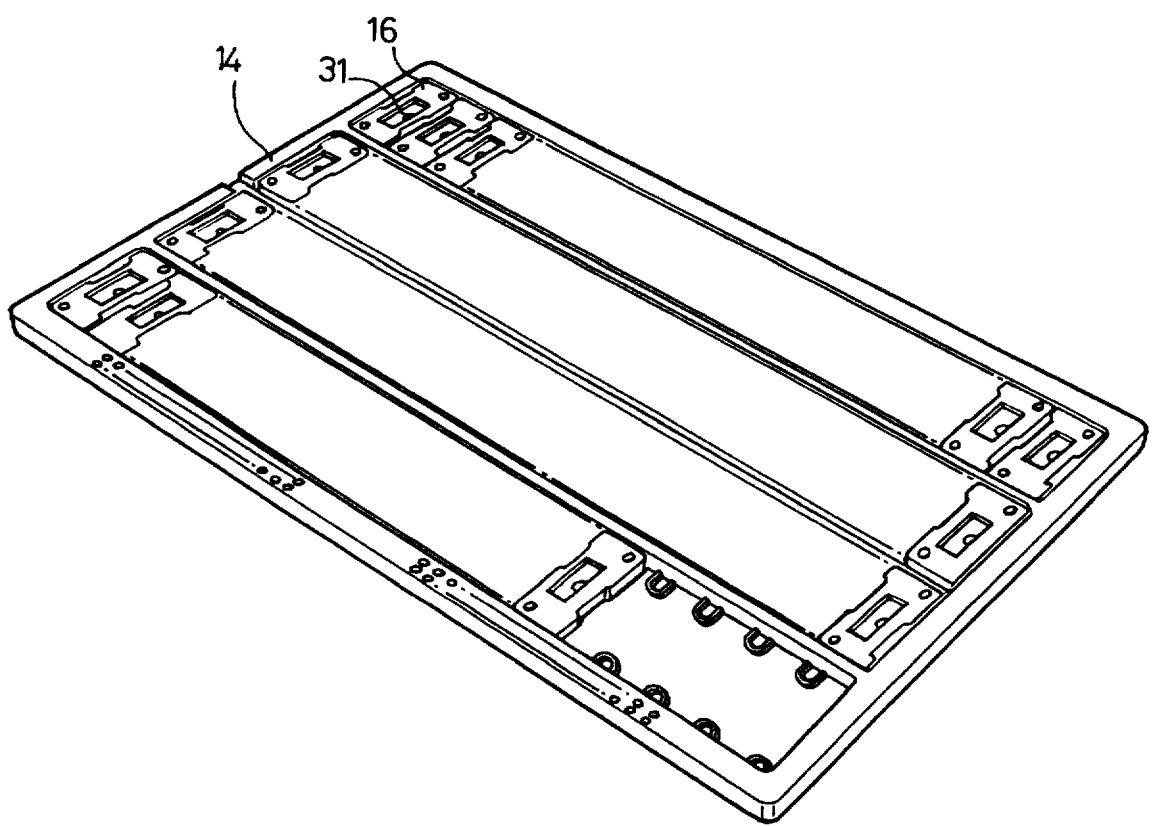
Figure 12:
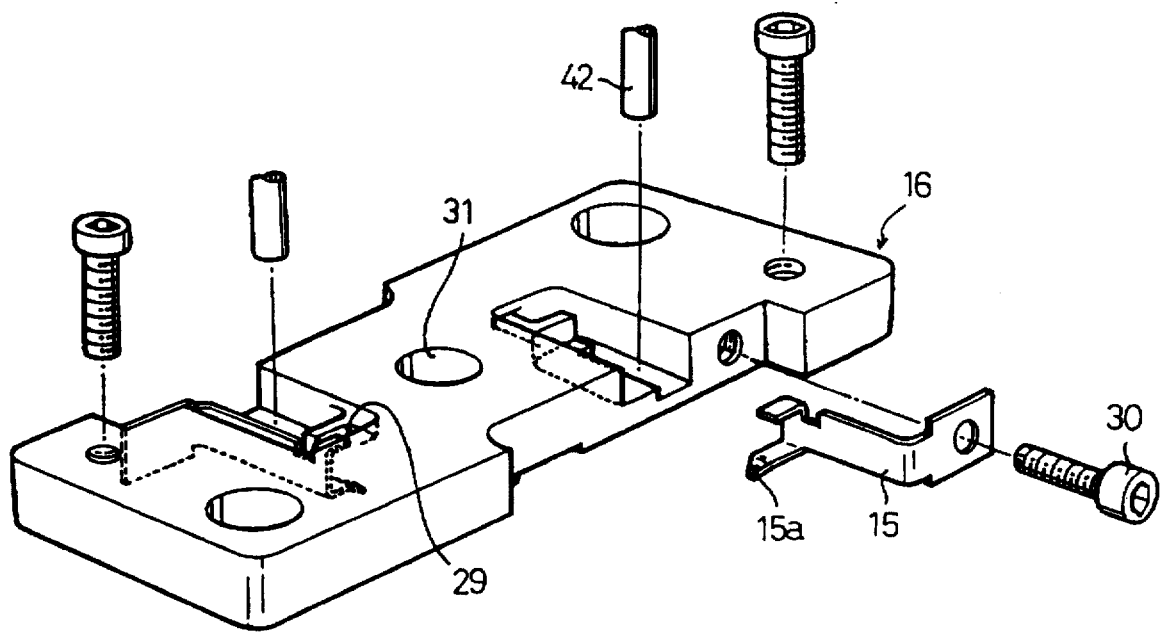
Figure 13:
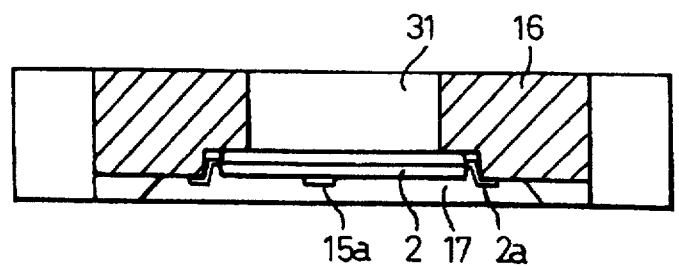
Figure 14A:
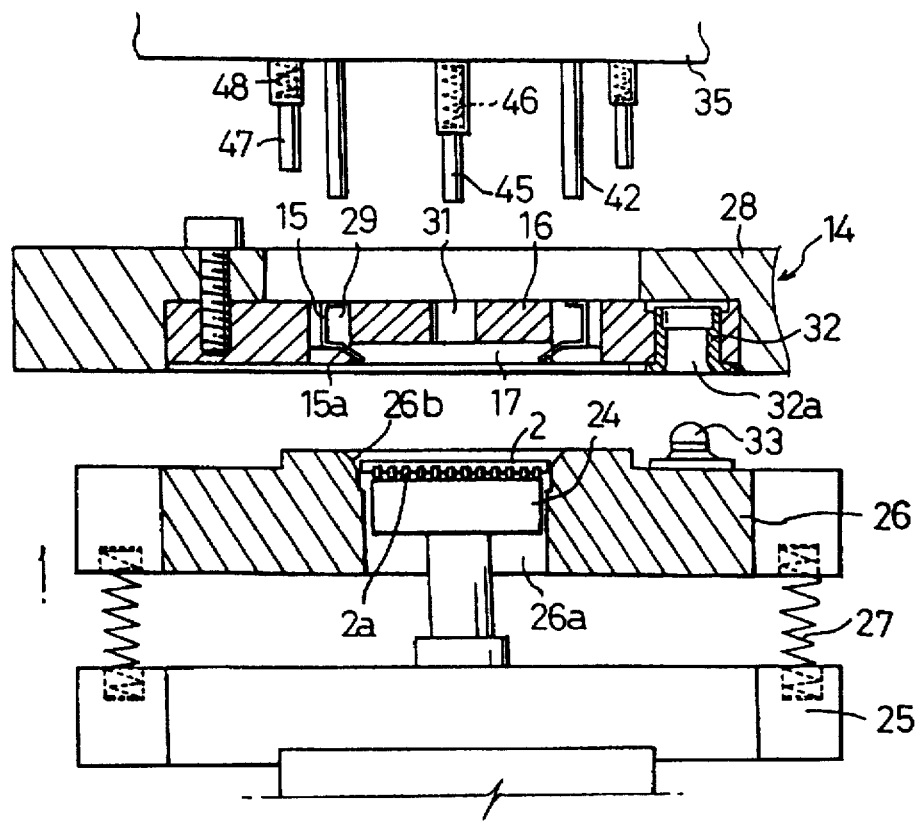
Figure 14B:
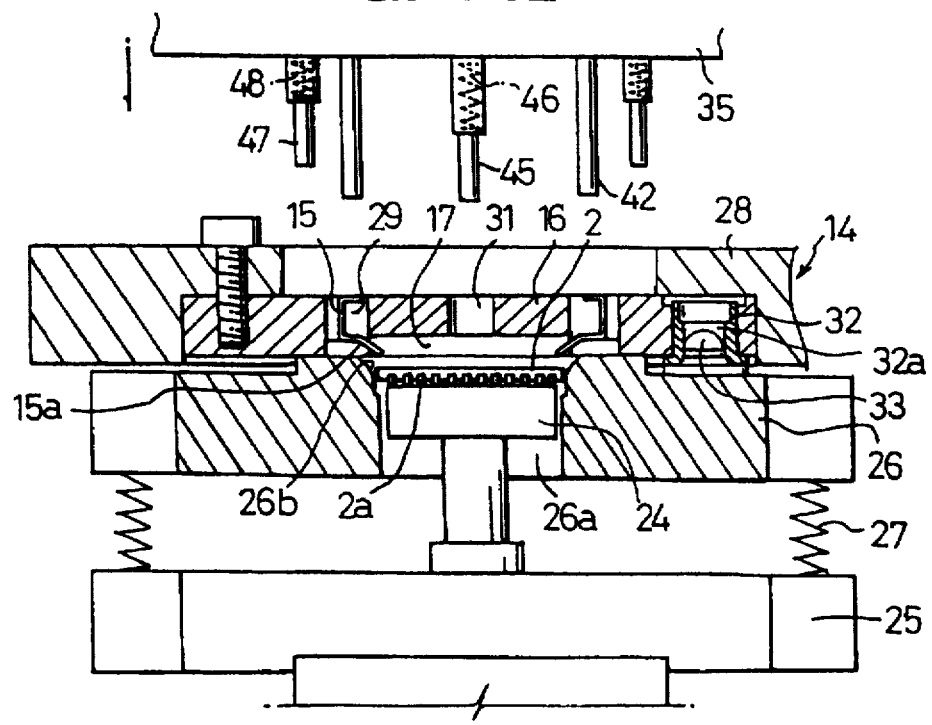
Figure 14C:
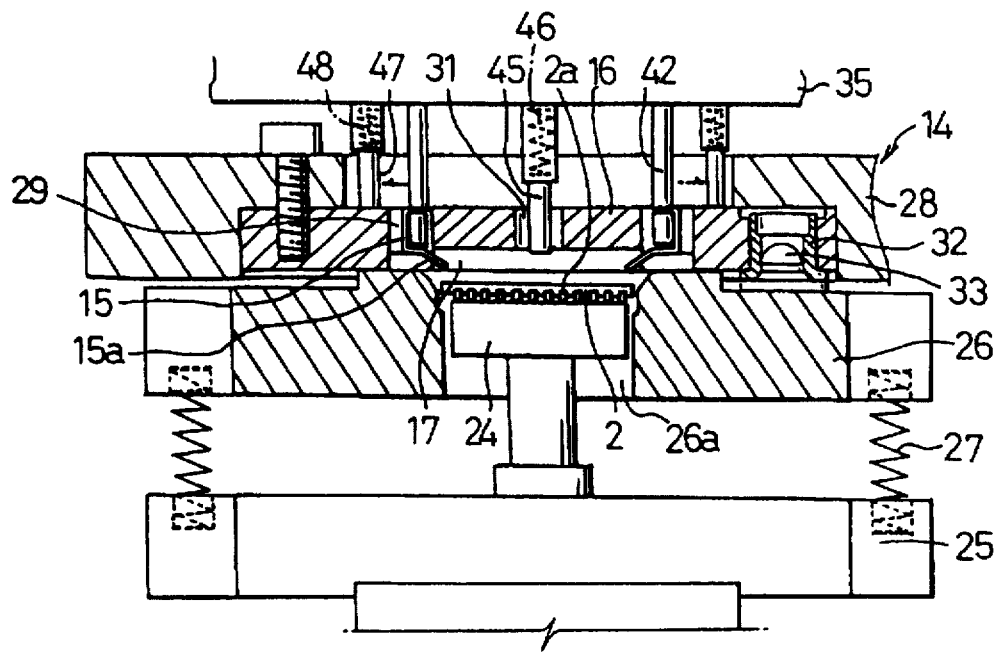
Figure 14D:
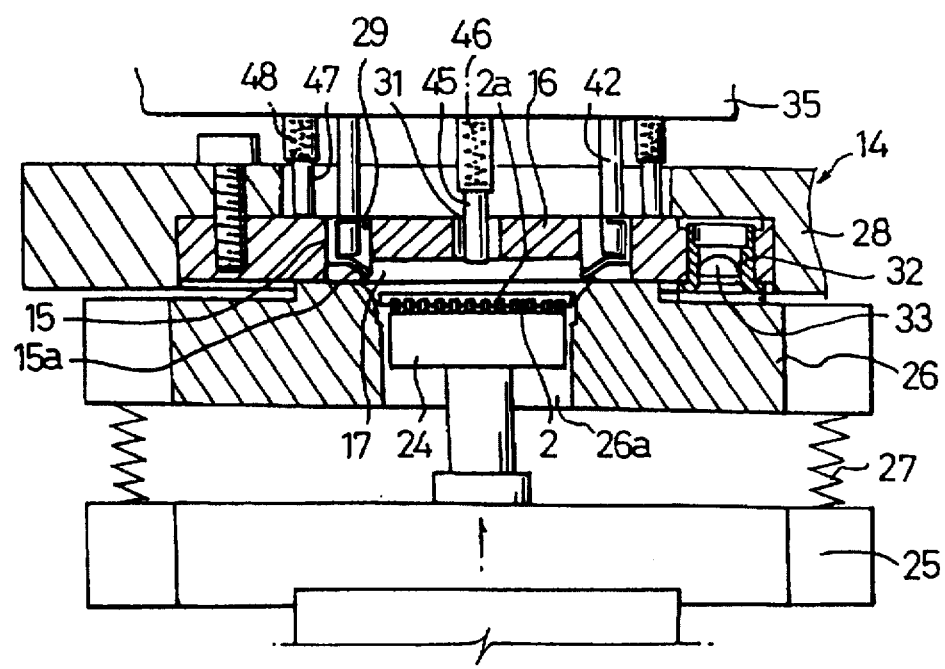
Figure 14E:
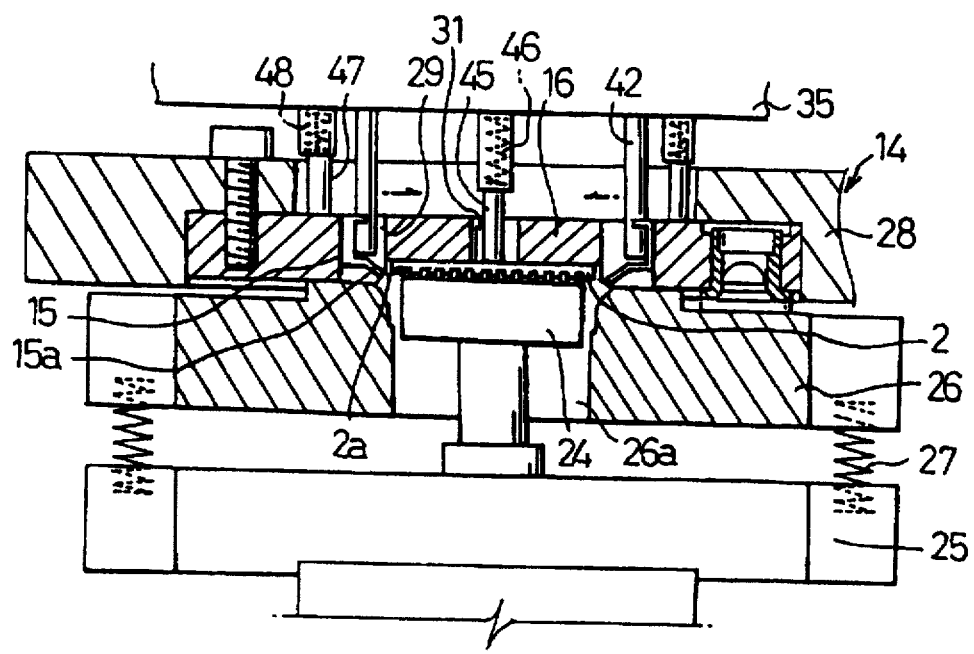
Figure 14F:
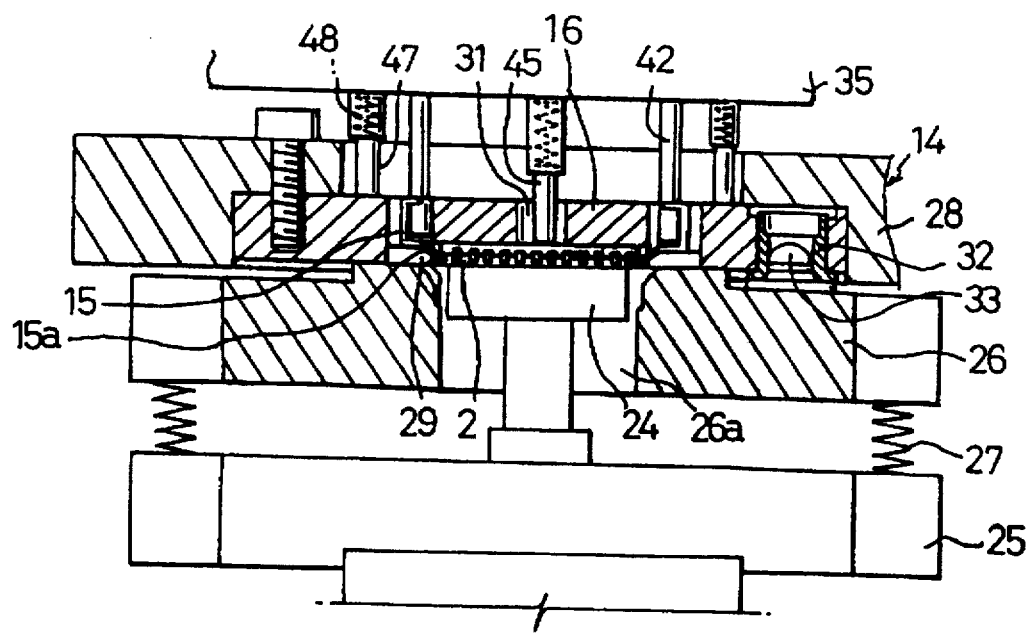

FIGS. 10A–10D are side views for explaining the carrying means of the stop member spreading means, FIG. 10A showing a case in which the stop member spreading means coincides with the first row of the carrier modules, FIG. 10B showing a case in which the stop member spreading means coincides with the second row of the carrier modules, FIG. 10C showing a case in which the stop member spreading means coincides with the third row of the carrier modules, and FIG. 10D showing a case in which the stop member spreading means coincides with the fourth row of the carrier modules;

FIG. 11 is a perspective view of a test tray on which a device is loaded;

FIG. 12 is an exploded perspective view of the carrier modules forming the test tray;

FIG. 13 is a vertical sectional view of FIG. 12 in a coupled state;

FIGS. 14A–14F are vertical sectional views for explaining the operation of the present invention, FIG. 14A showing a state in which one device is put on the mounting block and position-determined, FIG. 14B showing a state in which the align block is raised to be connected with the bottom of the carrier module, FIG. 14C showing a state in which the second lift piece is lowered for the stop member spreading pin to be connected with one side of the stop member, FIG. 14D showing a state in which the stop member spreading block moves toward both sides to spread the stop member outward, FIG. 14E showing a state in which the mounting block is raised to be placed in the space of the carrier module, and FIG. 14F showing a state in which the stop member spreading block returns to its initial state for the stop member to hold the device and for the mounting block to be lowered.

DETAILED DESCRIPTION OF PREFERRED EMBODIMENT

Hereinafter, a preferred embodiment of the device loading/unloading apparatus of the present invention will be described with reference to FIGS. 4–14.

The device loading/unloading apparatus of the present invention comprises a bottom loading means for correcting the position of a device in the customer tray and then carrying it directly under a test tray 14, test tray 14 having a plurality of carrier modules 16 with a stop member 15 for holding the device to cause its bottom to be exposed downward, a stop member spreading means for holding or releasing the device contained in the bottom loading means in space 17 of carrier module 16, and a conveying means for carrying the stop member spreading means.

The configuration of the device bottom loading means will be discussed below. Referring to FIGS. 4, 5, 6, and 14, a carrying piece 20 is installed to be movable along a horizontal LM guider 19 fixed to a side plate 18. To one side of the carrying piece, a third cylinder 21 is fixed, whose rod is directed downward. A first cylinder 23 of a stroke larger than the third cylinder is secured to a fixing plate 22 fastened to the third cylinder's rod.

A first lift piece 25 is fixed to first cylinder 23's rod. A plurality of mounting blocks 24, on which device 2 contained in the customer tray and carried by a pickup means (not shown) is mounted, are fixed to first lift piece 25. Onto the first lift piece 25, there is elastically installed an align block 26 with a space 26a into which mounting block 24 is fitted. In case first and third cylinders 23 and 21 operate with the bottom of align block 26 restrained, the align block 26 is lowered while compressing a spring 27.

On the top of space 26a formed in align block 26, an inclined surface 26b is formed as a device position determining means. This purpose is to allow device 2 carried by the pickup means to be guided along inclined surface 26b and thus accurately mounted on mounting block 24, when the device falls thereto via space 26a. This device bottom loading means is installed to reciprocate by a separate driving means from the loading position of the device contained in the customer tray to its position held in test tray 14.

Referring to FIGS. 11, 12, and 13, there will be described the test tray which holds device 2 contained in the customer tray, heats it in a soak chamber (not shown) in test conditions, and carries it to the testing portion.

Test tray 14 movably couples a plurality of carrier modules 16 shown in FIGS. 12 and 13 onto a rectangular frame 28. Device 2 carried by the device bottom loading means is held in space 17 formed on the bottom of the carrier module 16.

On the bottom of carrier module 16, a through-hole 29 is formed on both sides of space 17 to be placed outside the device's length. A stop member 15 having a stop piece 15a is fixed on the through-hole with a screw 30 so that stop piece 15a is placed inside the device length when external force is not applied to the stop member. Therefore, stop piece 15a supports both ends of device 2 so that the device held in carrier module 16 does not fall downward by its own weight even when space 17 is directed downward.

On the center of carrier module 16, an extracting hole 31 is formed to communicate with space 17. A bushing 32 with a guide hole 32a is fixed to both sides of the carrier module 16. Extracting hole 31 is to easily pull out device 2 held in space 17 during its unloading. Bushing 32 is to allow a position determining pin 33 fixed to the top of the align block to be inserted to match mounting block 24 and space 17 when carrier module 16 and align block 26 are connected.

Figure 1:
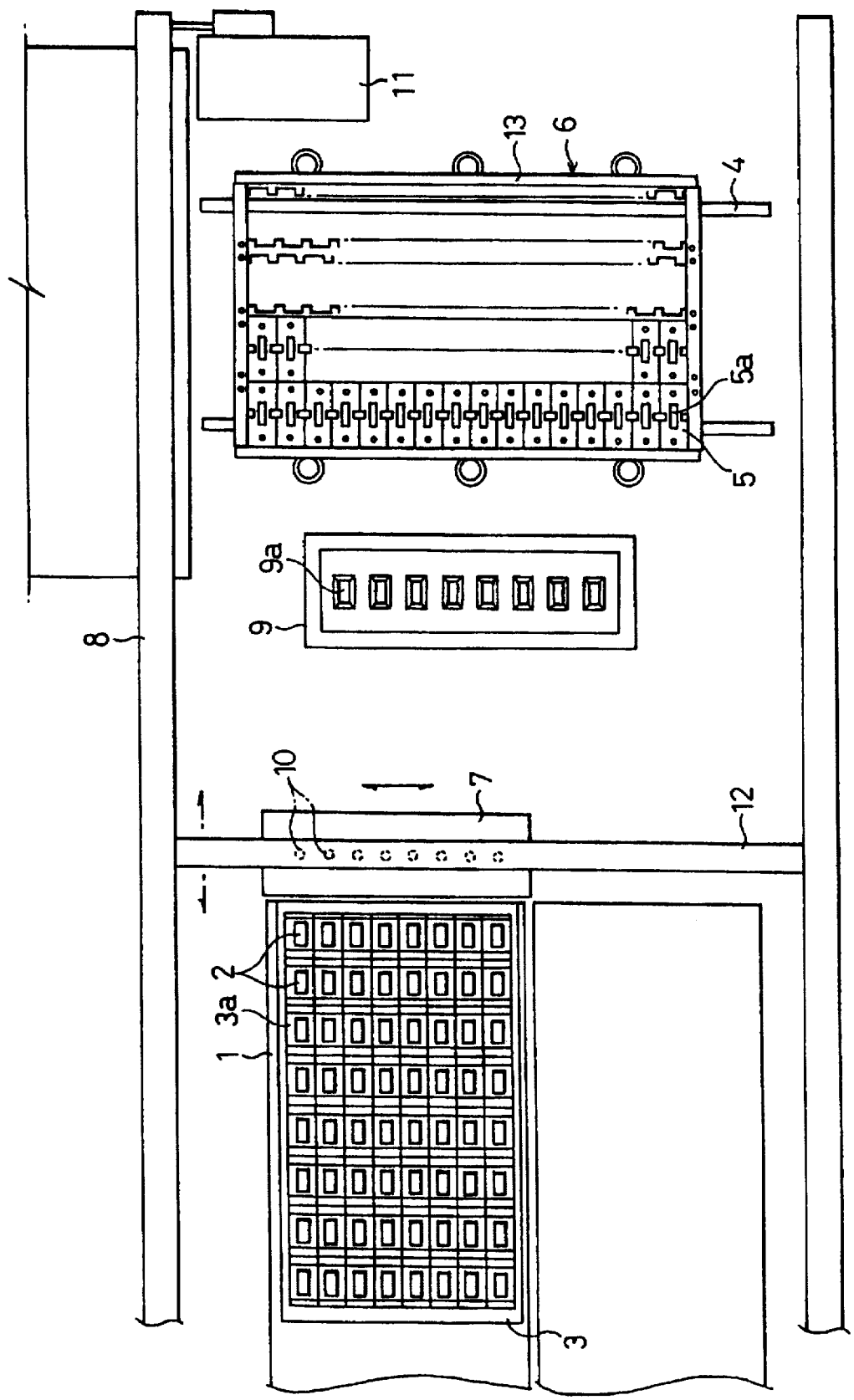
FIG. 1 is a plan view of a device handler on which a conventional loading/unloading apparatus is installed.
Figure 2:
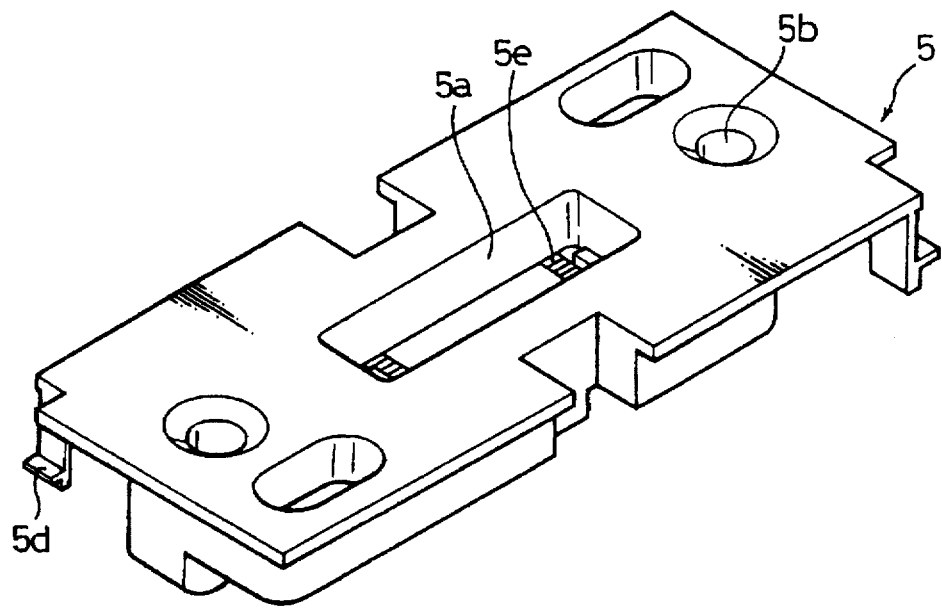
FIG. 2 is a perspective view of a prior art carrier module of a test tray.
Figure 3:
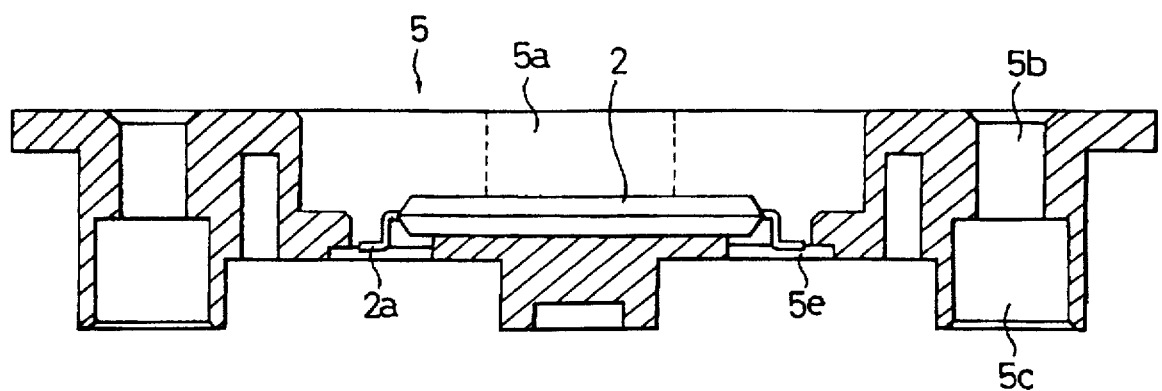
FIG. 3 is a vertical sectional view of FIG. 2.
Figure 4:
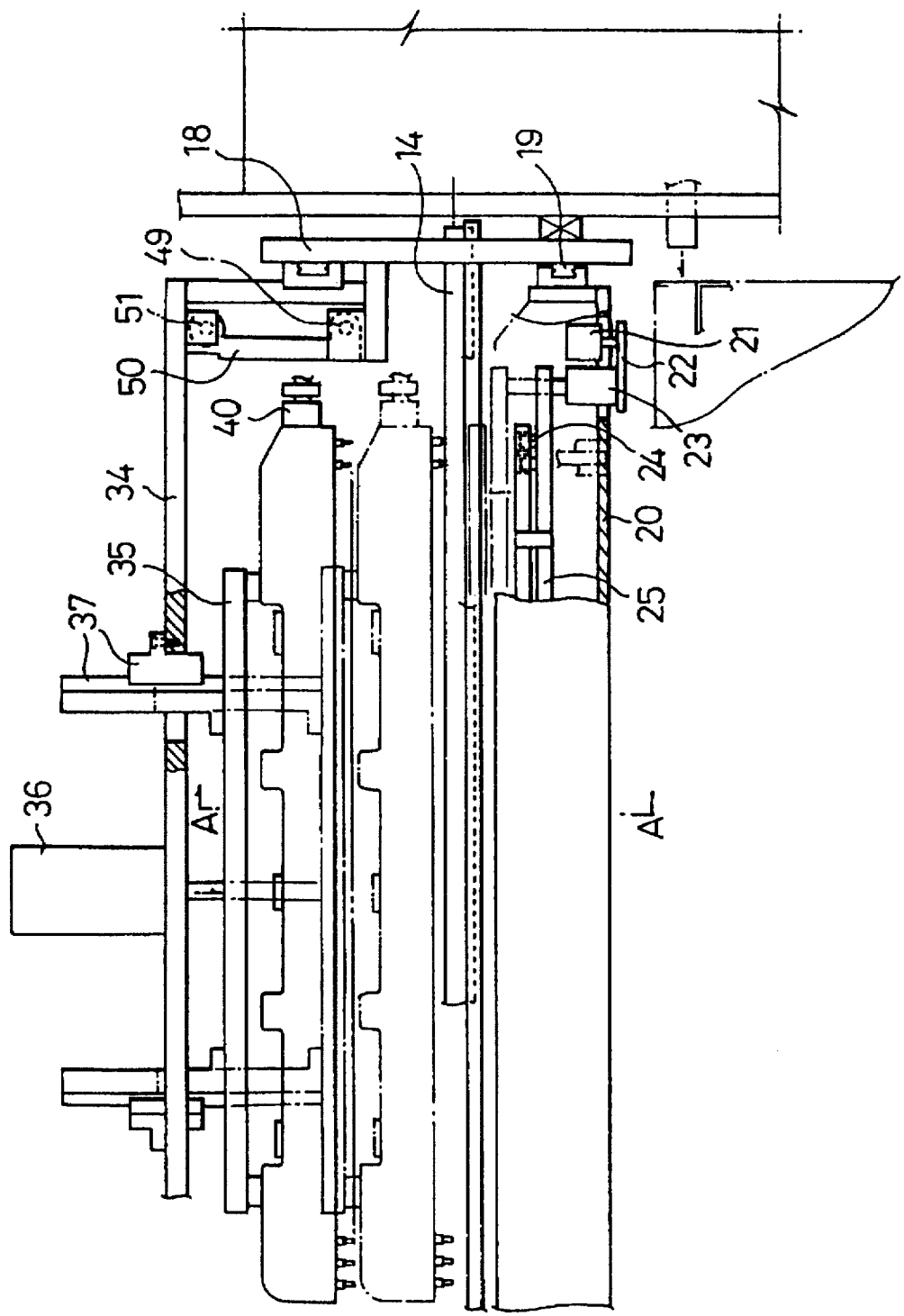
FIG. 4 is a partially cutaway front view of an apparatus of the present invention.
Figure 5:
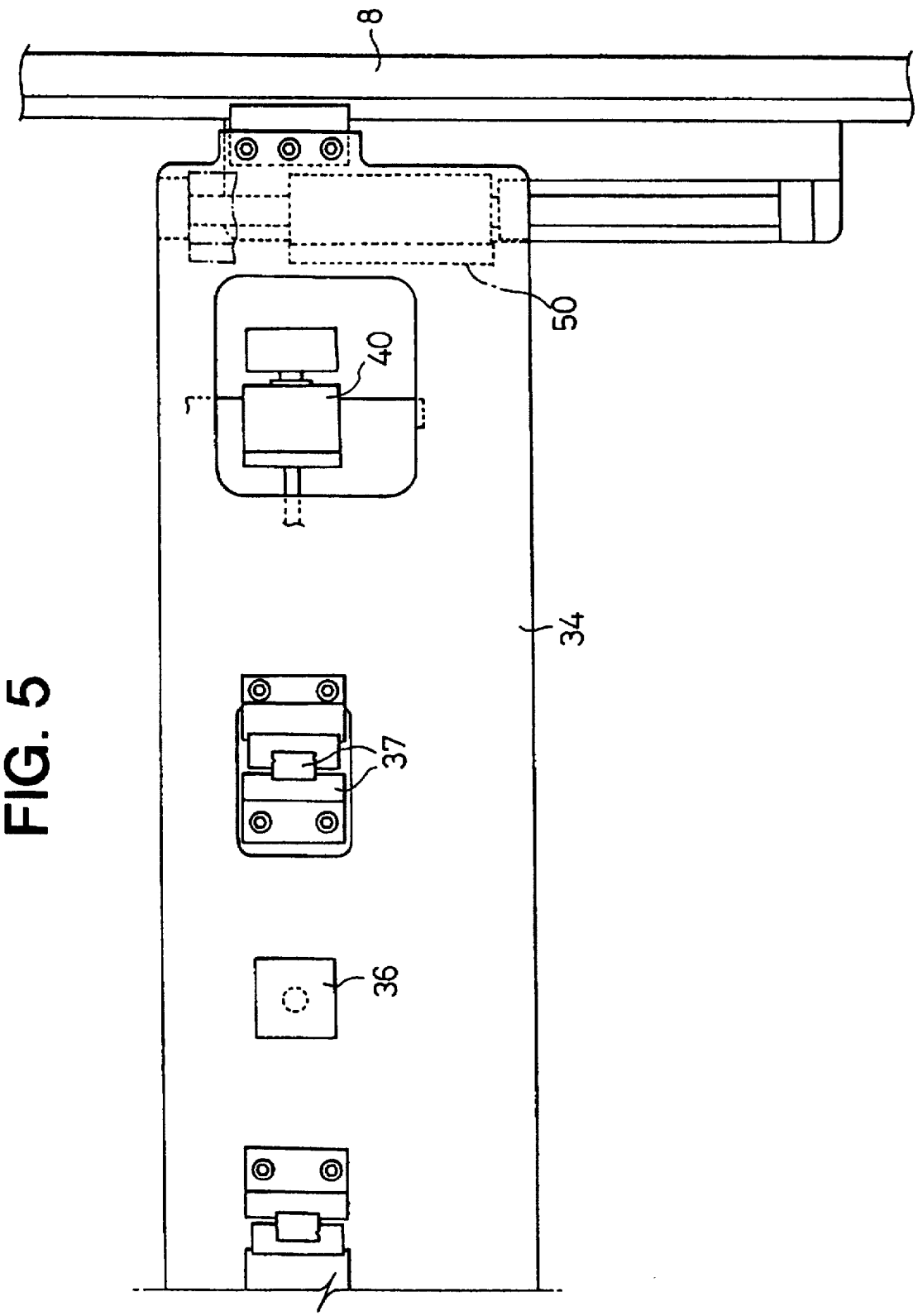
FIG. 5 is a plan view of FIG. 4.
Figure 9:
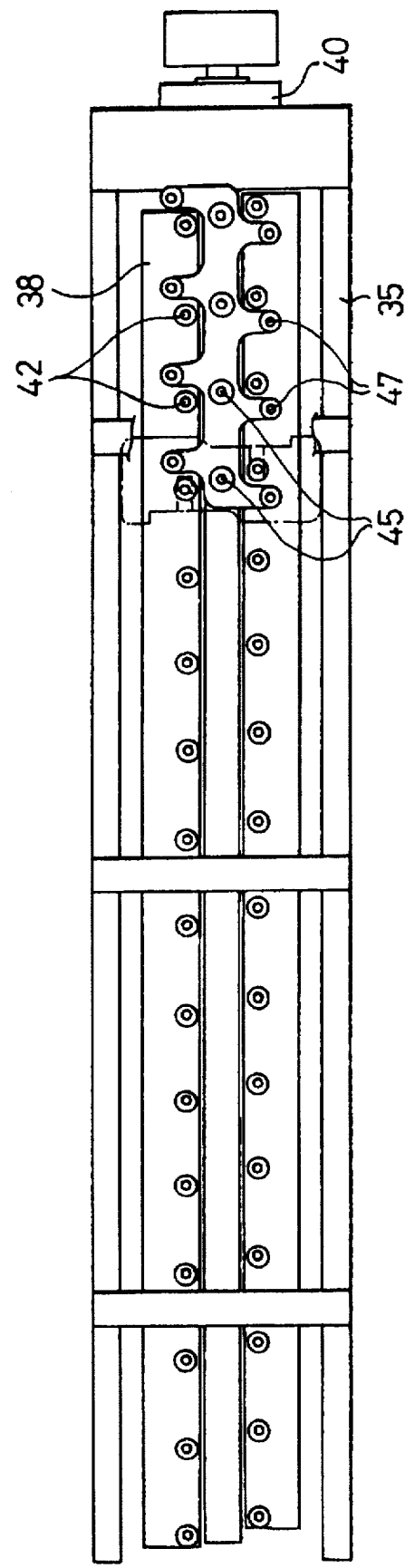
FIG. 9 is a bottom view of FIG. 8, part of which is omitted.

Referring to FIGS. 4, 7 and 9, the stop member spreading means is constructed so that a second lift piece 35 is installed on a top plate 34 horizontally moving along side plate 18. Second lift piece 35 is raised or dropped by being guided to guide piece 37 when second cylinder 36 is driven. A pair of stop member spreading blocks 38 are installed on the second lift piece to be fitted into a guide rod 39. As a slider 41 advances or retreats by a driving means such as fourth cylinder 40, the stop member spreading block 38 is guided to the guide rod 39 to thereby move left and right.

A stop member spreading pin 42 entering or exiting through-hole 29 formed on carrier module 16 is secured to the bottom of stop member spreading block 38. When second lift piece 35 falls with second cylinder 36 driven, stop member spreading pin 42 is fitted into through-hole 29 formed in carrier module 16.

A protruding portion 41a is formed on both ends of slider 41 which is fixed to fourth cylinder 40's rod to advance or retreat according to the fourth cylinder. A recess 38a for accepting the protrusion portion is formed in stop member spreading block 38. A protrusion member 43 such as a bearing is installed in the recess to connect to a narrower portion 41b of the slider. A spring 44 is fixed between stop member spreading blocks 38 at a predetermined interval.

When slider 41 advances, protruding portion 41a pushes protrusion member 43 so that stop member spreading block 38 is spread outward while expanding spring 44. Conversely, when slider 41 returns to its initial position, stop member spreading block 38 shrinks inward due to spring 44's restoring force. Protrusion member 43 is made with a bearing in order to minimize friction and noise when protruding portion 41a is repeatedly coupled to slider 41 which retreats or advances.

Figure 6:
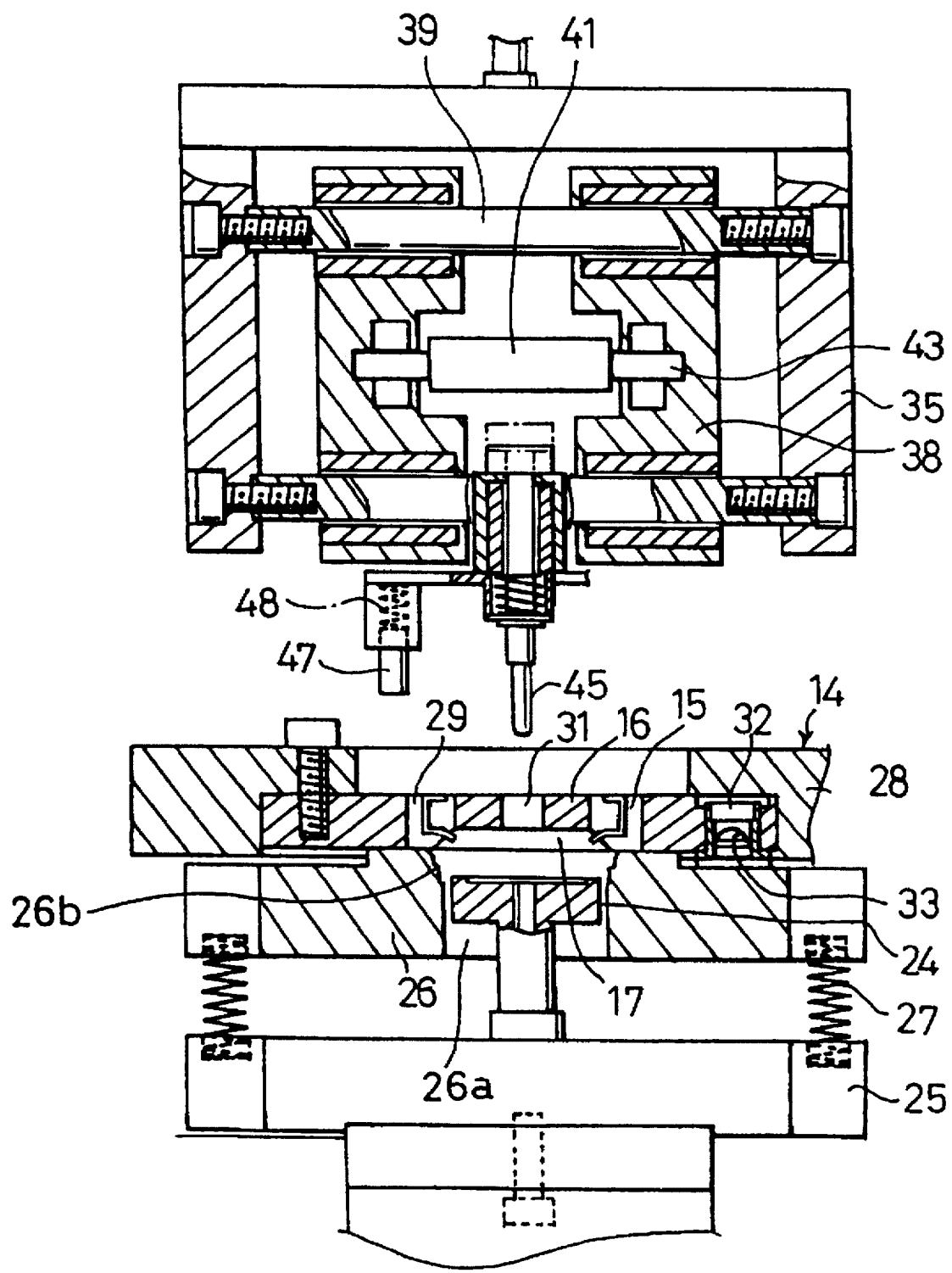
FIG. 6 is a sectional view of FIG. 4 cut along line A—A.

As shown in FIGS. 6 and 9, an extracting pin 45 is elastically installed on the center of second lift piece 35, being inserted into extracting hole 31 formed on the center of carrier module 16 when the second lift piece is lowered. Outside the extracting pin 45, a carrier module movement preventing pin 47 for pressing the top of carrier module 16 is elastically installed by spring 48 so that the carrier module is prevented from moving when device 2 is loaded/unloaded.

Referring to FIGS. 10A–10D, a first rodless cylinder 49 is fixed to side plate 18 so that the lower portion of a carrying block 50 is movably fitted into the first rodless cylinder. The top of the carrying block is movably fitted into second rodless cylinder 51 secured to top plate 34. In other words, when first and second rodless cylinders 49 and 51 are driven selectively, the stop member spreading means is made to coincide with one row of the carrier modules of test tray 14. First and second rodless cylinders 49 and 51 are driven when four sensors (not shown) fixed to one-side side plate 18 detect the sensors of the top plate.

The operation and effect of the present invention will be described below.

The pickup means adsorbs a device contained in the customer tray. With reference to FIG. 4, carrying piece 20 moving along horizontal LM guider 19 operates starting from the device's loading position in order to load the adsorbed device to the device bottom loading means.

Here, the rods of first and third cylinders 23 and 21 of the device bottom loading means (FIG. 4) are both lowered so that align block 26 (FIG. 26) fixed to first lift piece 25 is located at the lower dead point. In addition, second and fourth cylinders 36 and 40 of the stop member spreading means as shown in FIGS. 4, 5, 6, 7 do not operate so that second lift piece 35 is located at the upper dead point. Protrusion member 43 (FIGS. 6–8) installed in recess 38a of stop member spreading block 38 is connected to narrower portion 41b of slider 41 as shown in FIG. 7 so that stop member spreading block 38 shrinks inward due to spring 44's restoring force. Further, first and second rodless cylinders 49 and 51, the carriers of the stop member spreading means (FIGS. 4 and 10a–10d), are OFF so that as shown in FIG. 10A, the stop member spreading means coincides with one row of carrier modules 16 mounted on test tray 14.

In this state, when a plurality of devices contained in the customer tray are adsorbed by the pickup means and carried on the top of the device bottom loading means, and then the vacuum pressure is released, the devices fall freely to be mounted on the top of mounting block 24 via space 26a of align block 26 as shown in FIG. 6. Here, the devices are guided by inclined surface 26b formed on the top of the space 26a, and then mounted on mounting block 24 while their position is corrected accurately.

As stated above, when the devices contained in the customer tray are carried by the adsorbing means and put on mounting block 24 at a precise position, a linear motor (not shown) is driven to guide carrying piece 20 to horizontal LM guider 19 fixed to side plate 18 as shown in FIG. 4 so that the carrying piece horizontally moves to coincide with one row of carrier module 16 mounted on test tray 14, and then stops. This indicates that space 17 of carrier module 16 and device 2 put on mounting block 24 are placed on a perpendicular line as shown in FIGS. 14a–14f.

Here, the stop member spreading means placed on the top of test tray 14 waits while coinciding with one row of carrier modules 16, as explained above. (see FIGS. 10A and 14A) In other words, first and second rodless cylinders 49 and 51 are OFF so that carrying block 50 and top plate 34 retreat toward the customer tray.

In this condition, when first cylinder 23 fixed to carrying piece 20 is driven to raise first lift piece 25, the top of align block 26 elastically installed on the first lift piece 25 by spring 27 comes into contact with the bottom of carrier modules 16 mounted on test tray 14, as shown in FIG. 14B. During this operation, position determining piece 33 secured to align block 26 is fitted into guide hole 32a of bushing 32 fixed to carrier module 16 so that the position of the carrier module 16 movably coupled to test tray 14 is corrected.

Thereafter, when second cylinder 36 fixed to top plate 34 is driven to lower second lift piece 35 to the lower dead point, as shown in FIG. 14C, stop member spreading pin 42 fixed to stop member spreading block 38 is inserted into through-hole 29 formed on carrier module 16. Simultaneously, extracting pin 45 elastically installed by spring 46 is inserted into extracting hole 31, and carrier module movement preventing pin 47 is connected to the top of carrier module 16 with spring 48 compressed. Here, second lift piece 35 is guided to guide piece 37 and stably lowered. Device 2 mounted on mounting block 24 is in no contact with the bottom of carrier module 16.

While stop member spreading pin 42 is inserted into through-hole 29 of carrier module 16, fourth cylinder 40 fixed to second lift piece 35 operates to push slider 41. Accordingly, as shown in FIG. 7, protrusion member 43 coming into contact with narrower portion 41b of slider 41 is pushed outward by protruding portion 41a of the slider. As a result, stop member spreading block 38 is spread outward with spring 44 expanded. During this operation, stop member spreading block 38 stably operates because it is fitted into guide rod 39, as shown in FIG. 6.

When stop member spreading block 38 is spread, stop member 15 placed in through-hole 29 is also spread as shown in FIG. 14D. For this reason, the distance between the ends of stop piece 15a becomes wider than the length of the device.

When space 17 formed on the bottom of carrier module 16 is opened (the device can be inserted in this case), third cylinder 21 fixed to carrying piece 20 operates to raise first cylinder 23 see FIG. 4. As a result, align block 26 fixed to first cylinder 23 is raised. The top of align block 26 elastically installed by spring 27 is in contact with the bottom of carrier module 16 so that the position of the align block does not vary. As shown in FIG. 14E, only mounting block 24 is raised. The top of device 2 put on the mounting block comes into contact with the bottom of space 17 formed on carrier module 16. Accordingly, extracting pin 45 exposed in space 17 via extracting hole 31 is raised while pressed by the top of device 2 to compress spring 46.

In this state, fourth cylinder 40 fixed to second lift piece 35 and advancing slider 41 operates to pull the slider 41. When slider 41 retreats, protruding portion 41a gets out of protrusion member 43 to allow narrower portion 41b of the slider to come into contact with the protrusion member. Therefore, stop member spreading block 38 returns to its initial position due to spring 44's restoring force. Stop member spreading pin 42 fixed to the bottom of the stop member spreading block moves inward in the arrow direction of FIG. 14E so that stop member 15 returns to its initial position due to the restoring force of spring 44. Stop piece 15a holds device 2 positioned in space 17 of carrier module 16. (see FIG. 14F) Through the above procedure, positioning the device contained in the customer tray and then loading it in the test tray is finished.

After the operation, second cylinder 36 operates to raise second lift piece 35 so that carrier module movement preventing pin 47 is separated from the top of carrier module 16. At the same time, first and third cylinders 23 and 21 sequentially operate to lower mounting block 24 and align block 26. Carrying piece 20 returns to its initial position (the loading position of the device contained in the customer tray), enabling the continuous operation.

For the continuous operation, the stop member spreading means must coincide with the second, third and fourth rows of carrier modules 16 mounted on test tray 14. This procedure will be described in detail with reference to FIGS. 10A–10D.

The stop member spreading means carries out four steps for simultaneously or selectively moving top plate 34 and carrying block 50 with first and second rodless cylinders 49 and 51.

As shown in FIG. 10A, in the first step, first and second rodless cylinders 49 and 51 are OFF so that top plate 34 and carrying block 50 both retreat (are placed on the side of the customer tray).

In the second step, first rodless cylinder 49 becomes OFF in the first step so that carrying block 50 stops and only second rodless cylinder 51 operates to carry top plate 34. (see FIG. 10B)

In the third step, first and second rodless cylinders 49 and 51 operate in the first step so that top plate 34 and carrying block 50 both advance (are placed on the side of the test tray). (see FIG. 10C)

In the fourth step, second rodless cylinder 51 becomes OFF in the first step so that top plate 34 stops but first rodless cylinder 49 operates to convey carrying block 50. (see FIG. 10D)

It would be understood that stop member spreading pin 42 fixed to stop member spreading block 38 coincides with through-hole 29 formed on the respective rows of carrier modules 16 through the above procedures.

Meanwhile, there will be explained a procedure in which device 2 is loaded on carrier module 16 of test tray 14 and tested in the testing portion, and then one row of devices held by carrier modules 16 are unloaded to mounting block 24 of the device bottom loading means.

First of all, carrying piece 20 is guided to horizontal LM guider 19 so that mounting block 24 having no device coincides with one row of carrier modules 16 holding device 2. Along the perpendicular line of the mounting block 24, the stop member spreading means is positioned with first and second rodless cylinders 49 and 51 driven.

In this state, like the loading of the device, first cylinder 23 fixed to carrying piece 20 is driven to raise first lift piece 25 so that as shown in FIG. 14B, the top of align block 26 comes into contact with the bottom of carrier module 16 mounted on test tray 14.

During the above procedure, position determining piece 33 fixed to align block 26 is fitted into guide hole 32a of bushing 32 fixed to carrier module 16. In other words, the position of the carrier modules movably coupled to test tray 14 is corrected so that device 2 held by carrier module 16 is precisely put on mounting block 24.

Subsequently, when second cylinder 36 fixed to top plate 34 is driven to lower second lift piece 35 to the lower dead point, stop member spreading pin 42 fixed to stop member spreading block 38 is inserted into through-hole 29 formed on carrier module 16, as shown in FIG. 14C. At the same time, extracting pin 45 elastically installed by spring 46 is inserted into extracting hole 31, and carrier module movement preventing pin 47 is connected to the top of carrier module 16 with spring 48 compressed. Here, extracting pin 45 is connected to the top of device 2 placed in space 17, to be raised with spring compressed 46.

After second lift piece 35 is placed at the lower dead point, third cylinder 21 fixed to carrying piece 20 operates to raise first cylinder 23 and then mounting block 24 fixed to first cylinder 23. The top of align block 26 elastically installed to the mounting block by spring 27 is connected with the top of carrier module 16 so that the align block 26 is not moved. Here, only mounting block 24 is raised, as shown in FIG. 14E. As a result, the bottom of mounting block 24 comes into contact with the bottom of device 2 held in space 17 of carrier module 16.

In this state, when fourth cylinder 40 fixed to second lift piece 35 operates to push slider 41, protrusion member 43 connected to narrower portion 41b of slider 41 is pushed outward by the protruding portion of the slider, as shown in FIG. 7. Therefore, stop member spreading block 38 is spread outward with spring 44 expanded.

As shown in FIGS. 8 and 9, stop member spreading pin 42 is fixed so that when stop member spreading block 38 is spread, stop member 15 placed in through-hole 29 is spread on the bottom of the stop block, as shown in FIG. 14D. Accordingly, the distance between the ends of stop piece 15a becomes wider than the length of the device, and device 2 supported by stop piece 15a of stop member 15 and placed in space 17 falls due to its weight to be mounted on the top of mounting block 24 placed thereunder.

When slider 41 moves stop member spreading block 38 outward in order for stop piece 15a to release device 2, extracting pin 45 raised by compressing spring 46 due to the top of the device falls into space 17 via extracting hole 31. Even when both ends of the device are slightly interrupted by the stop piece 15a due to the deformation of stop piece 15a, the device 2 is extracted from the space by the extracting pin 45.

When fourth cylinder 40 fixed to second lift piece 35 to advance slider 41 operates to pull the slider, protruding portion 41a gets out of protruding member 43. Here, narrower portion 41b of the slider is connected to the protrusion member so that stop member spreading block 38 returns to its initial state due to the restoring force of springs 44.

Second cylinder 36 operates to raise second lift piece 35 so that carrier module movement preventing piece 47 is separated from the top of carrier module 16. At the same time, first and third cylinders 23 and 21 operate sequentially to lower mounting block 24 and align block 26 and then convey carrying piece 20 to an empty customer tray. By doing so, the device put on mounting block 24 is unloaded to the empty customer tray by the pickup means. It would be understood that through the above procedures, continuous unloading of test-finished devices is enabled.

As described above, the present invention has the following advantages.

First, the position of devices loaded on the carrier module becomes accurate, and does not vary even with impacts with the test tray conveyance. This is because the device position-corrected by the align block and mounting block of the device bottom loading means is carried directly under the carrier module of the test tray, pushed upward into the space from the bottom of the carrier module, and then held by the stop member.

Secondly, the bottom of the device loaded in the space of the carrier module is exposed downward so that a test head coupled to the device's lead in test can be installed under the test portion. This facilitates replacing the test head, which is heavy, whenever a variety of devices are tested.

Thirdly, while the pickup means adsorbs the device contained in the customer tray and puts it on the mounting block, the device bottom loading means is carried directly under the test tray so that the device put on the mounting block is directly loaded in the space of the carrier module. Accordingly, this reduces time to load the device, and enhances productivity in accordance with performance test of the device.

What is claimed:

1. A device loading/unloading apparatus for selectively loading and unloading devices to and from a device handler each said device having a bottom, said apparatus comprising:

a customer tray containing at least one said device;

a test tray having a plurality of carrier modules, each of said carrier modules forming a space on its bottom for receiving one said device so that the device's bottom is exposed downwardly, each of said carrier modules having a stop member for supporting the device not to fall freely from said space;

bottom loading means for picking up the device from said customer tray, moving said device under said test tray, and loading said device to said bottom space of said carrier module; and stop member spreading means installed above said test tray and being conveyable in the same direction as said bottom loading means, said stop member spreading means being for spreading said stop member by a predetermined interval when said bottom loading means loads and unloads the device on and from the space of the carrier module.

2. A device loading/unloading apparatus for a device handler as claimed in claim 1, wherein the test tray has rows of carrier modules, said apparatus further comprising carrying means for carrying said stop member spreading means to coincide with one row of the carrier modules of said test tray.

3. A device loading/unloading apparatus for a device handler as claimed in claim 1, wherein said bottom loading means comprises:

device position determining means for determining the device's position when the device contained in said customer tray is loaded;

a carrying piece horizontally reciprocating between said customer tray and test tray;

a first lift piece selectively raised and lowered as first and third cylinders installed in said carrying piece are driven;

a plurality of mounting blocks fixed to said first lift piece and on which the devices position-determined by said position determining means are mounted; and an align block elastically installed to said first lift piece by a spring and on which a space to which said respective mounting blocks are fitted is formed.

4. A device loading/unloading apparatus for a device handler as claimed in claim 3, wherein said position determining means is an inclined surface formed on a top portion of said align block.

5. A device loading/unloading apparatus for a device handler as claimed in claim 1, wherein said stop member spreading means comprises:

a second lift piece raised or lowered as cylinders are driven;

a pair of stop member spreading blocks coupled to said second lift piece and being selectively movable toward and away from one another;

a slider movably installed between said stop member spreading blocks for moving said stop member spreading blocks away from one another;

driving means fixed to said second lift piece for moving said slider; and a stop member spreading pin fixed under each said stop member spreading block for spreading outward said stop member fixed to said carrier module as said stop member spreading block is moved by said slider.

6. A device loading/unloading apparatus for a device handler as claimed in claim 5, wherein a fourth cylinder is fixed onto said second lift piece and having a rod fixed to one side of said slider for moving said slider.

7. A device loading/unloading apparatus for a device handler as claimed in claim 5, wherein protruding portions are formed on both sides of said slider to be accepted into a recesses formed in said stop member spreading blocks, said recess having a protrusion member coupled to a narrower portion placed on one side of said protruding portion, wherein springs are fixed between said plurality of stop member spreading blocks at a predetermined interval for urging said stop member spreading blocks toward one another.

8. A device loading/unloading apparatus for a device handler as claimed in claim 7, wherein said protrusion member to which said protruding portion is coupled comprises a bearing.

9. A device loading/unloading apparatus for a device handler as claimed in claim 5, wherein an extracting pin inserted into an extracting hole of said carrier modules is elastically installed by a spring at the center of said second lift piece.

10. A device loading/unloading apparatus for a device handler as claimed in claim 9, wherein a carrier module movement preventing pin is elastically installed by a spring on both sides of said extracting pin formed at the center of said second lift piece, said carrier module movement preventing pin pressing the top of said carrier modules when said second lift piece is lowered.

11. A device loading/unloading apparatus for a device handler as claimed in claim 9, wherein said carrying means of said stop member spreading means comprises:

a side plate formed between said customer tray and test tray;

a first rodless cylinder fixed to said side plate;

a carrying block having a portion coupled to said first rodless cylinder, said block horizontally moving as said first rodless cylinder is driven; and a second rodless cylinder coupled to the upper portion of said carrying block and fixed to the top of said stop member spreading means, said cylinder horizontally moving said stop member spreading means, whereby said stop member spreading means coincides with one row of said carrier modules as said first and second rodless cylinders operate sequentially.

* * * * *